US012628582B2

(12) United States Patent (10) Patent No.: US 12,628,582 B2
Duan et al. (45) Date of Patent: May 12, 2026

(54) METHOD OF REMOVING A BY-PRODUCT FROM A COMPONENT OF A SEMICONDUCTOR APPARATUS

(71) Applicant: TAIWAN SEMICONDUCTOR MANUFACTURING COMPANY LTD., Hsinchu (TW)

(72) Inventors: Ren-Guan Duan, Hsinchu (TW); Chen-Hsiang Lu, Hsin-Chu City (TW); Chin-Feng Lin, Hsinchu County (TW); Tung-Hsiung Liu, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 909 days.

(21) Appl. No.: 17/811,082

(22) Filed: Jul. 7, 2022

(65) Prior Publication Data

US 2024/0014029 A1 Jan. 11, 2024

(51) Int. Cl.
| | |
|---|---|
| *H01L 21/02* | (2006.01) |
| *B08B 7/00* | (2006.01) |
| *C23C 16/44* | (2006.01) |
| *H01L 21/67* | (2006.01) |

(52) U.S. Cl.
CPC ........ *H01L 21/0214* (2013.01); *B08B 7/0071* (2013.01); *C23C 16/4407* (2013.01); *H01L 21/02326* (2013.01); *H01L 21/6704* (2013.01); *H01L 21/67109* (2013.01)

(58) Field of Classification Search
None
See application file for complete search history.

(56) References Cited

U.S. PATENT DOCUMENTS 5,075,641 A * 12/1991 Weber ...................... H03B 5/36
204/192.18

FOREIGN PATENT DOCUMENTS

| | | | | | |
|---|---|---|---|---|---|
| CN | 101792273 A | * | 8/2010 | | |
| JP | 2003126795 A | * | 5/2003 | ....... | H01L 21/67069 |

OTHER PUBLICATIONS

Machine translation: JP-2003126795-A; Seika, S. (Year: 2003).*
Machine translation: CN-101792273-A; Jia, H. (Year: 2010).*

* cited by examiner

*Primary Examiner* — Natasha N Campbell
(74) *Attorney, Agent, or Firm* — WPAT LAW; Anthony King

(57) ABSTRACT

A method of removing a nitride-containing by-product from a component of a semiconductor apparatus includes heating the component to a predetermined temperature for a predetermined duration, wherein the nitride-containing by-product is transformed into an oxide-containing or oxynitride-containing product by the heating; and removing the oxide-containing or oxynitride-containing product with an acid solution. Another method of removing a by-product from a component of a semiconductor apparatus includes heating the component to a predetermined temperature; cooling the component from the predetermined temperature to a room temperature; rinsing the component with an acid solution including and $HNO_3$ after the component is cooled; and washing the by-product and the acid solution off the component.

20 Claims, 23 Drawing Sheets

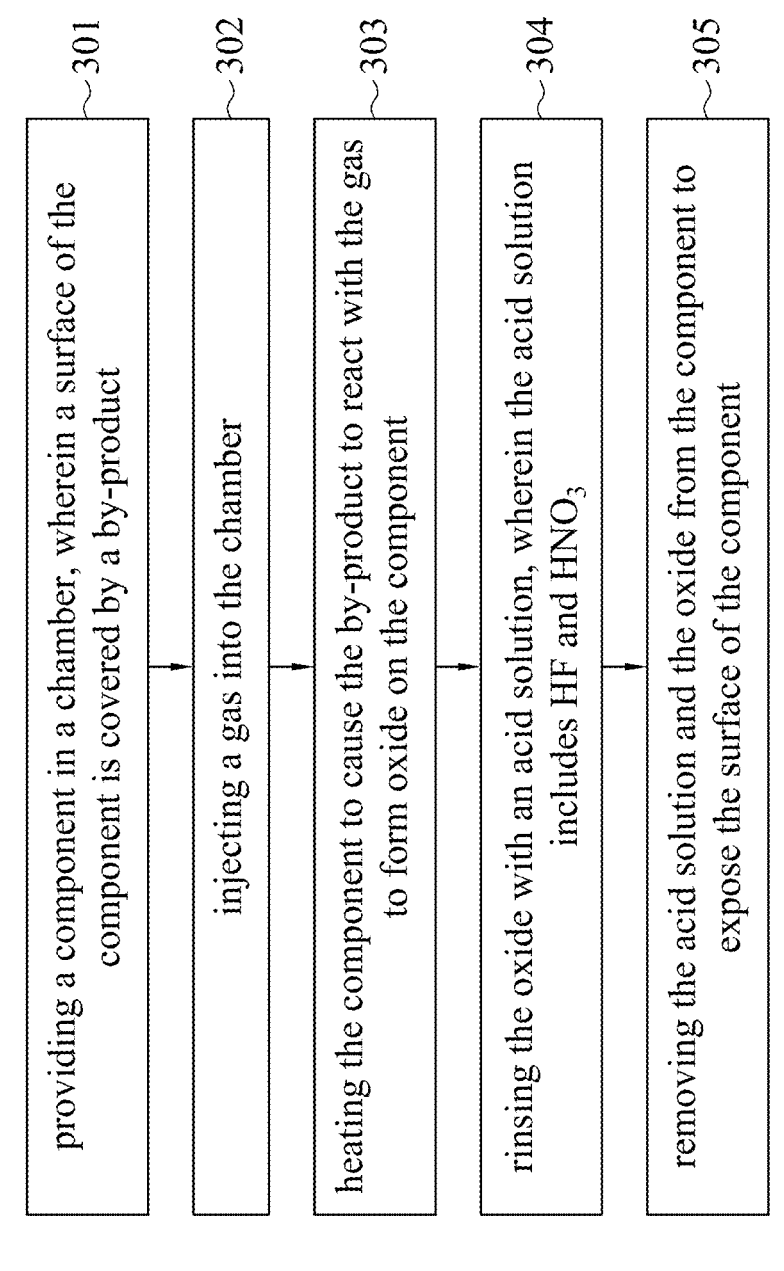

300

301 providing a component in a chamber, wherein a surface of the component is covered by a by-product 302 injecting a gas into the chamber 303 heating the component to cause the by-product to react with the gas to form oxide on the component 304 rinsing the oxide with an acid solution, wherein the acid solution includes HF and $HNO_3$ 305 removing the acid solution and the oxide from the component to expose the surface of the component

FIG. 3

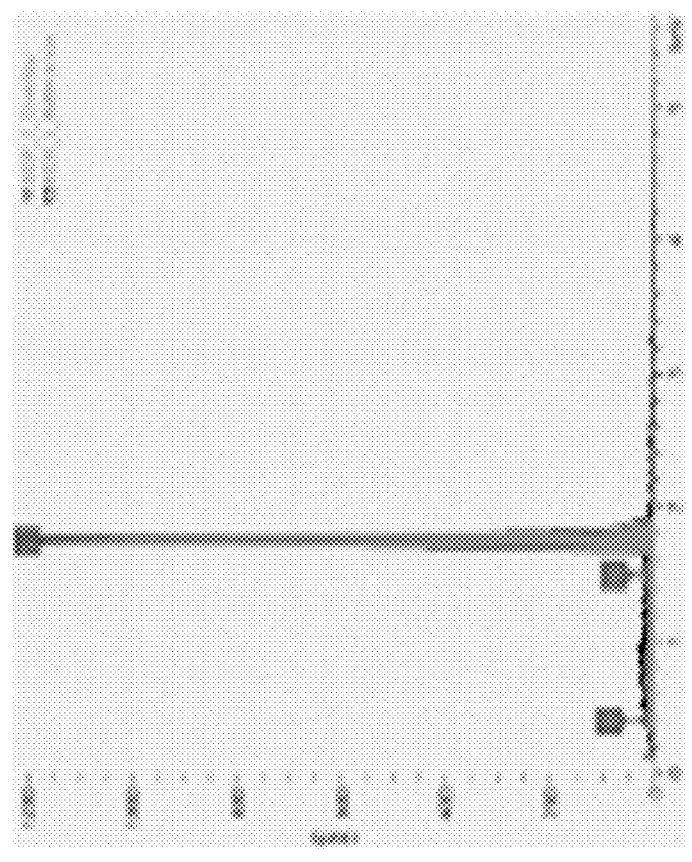
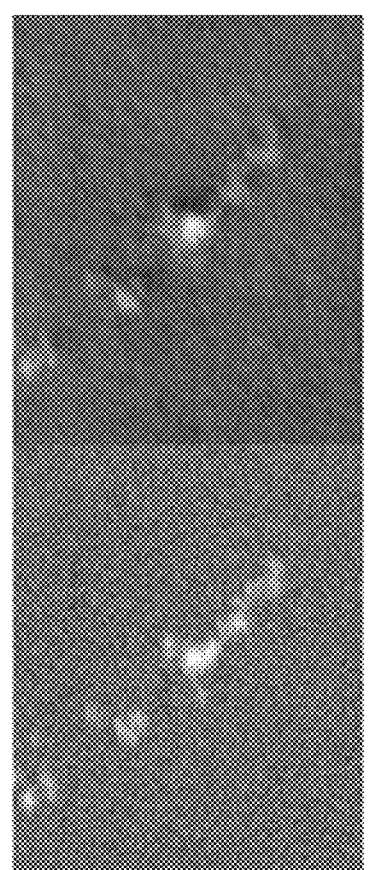
FIG. 14A

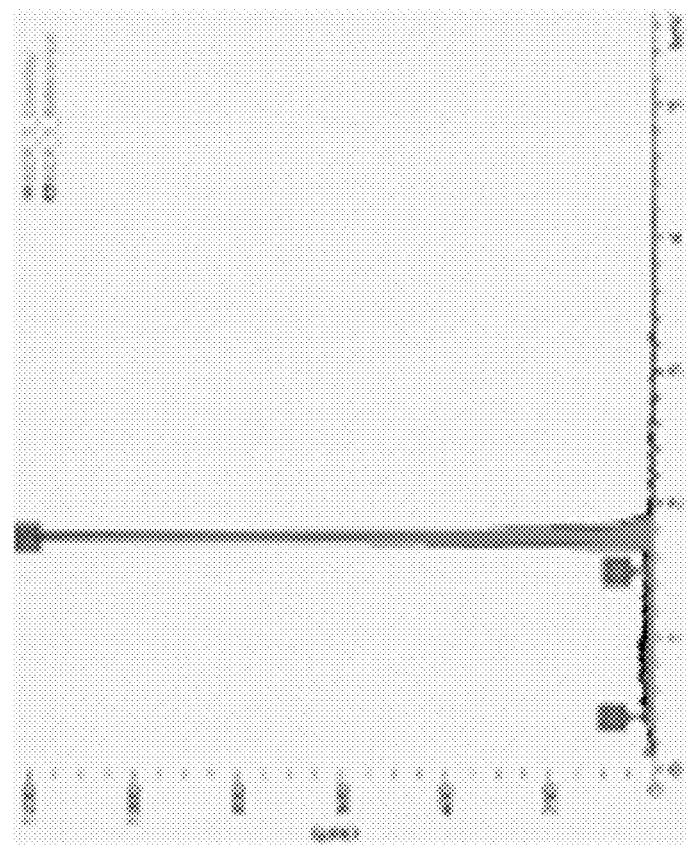
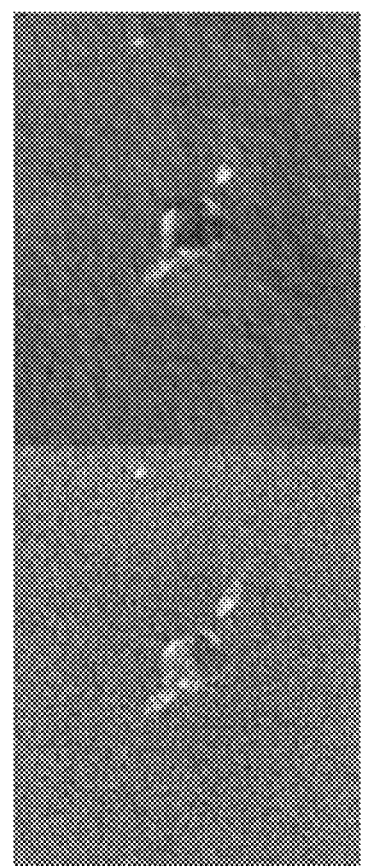
FIG. 14B

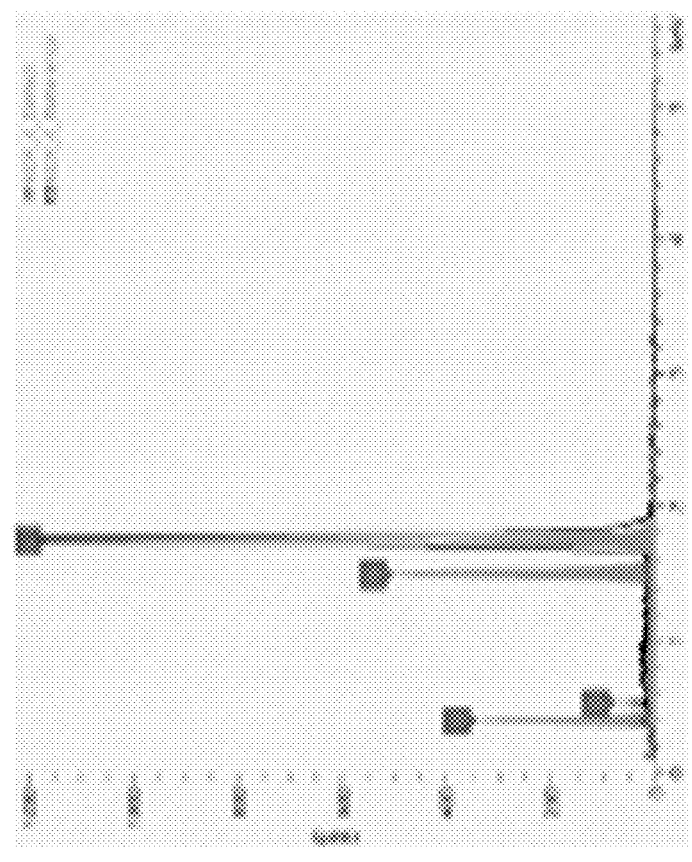
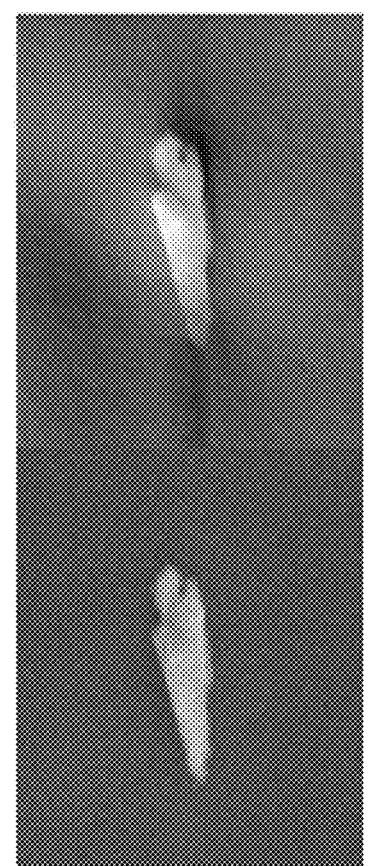
FIG. 14C

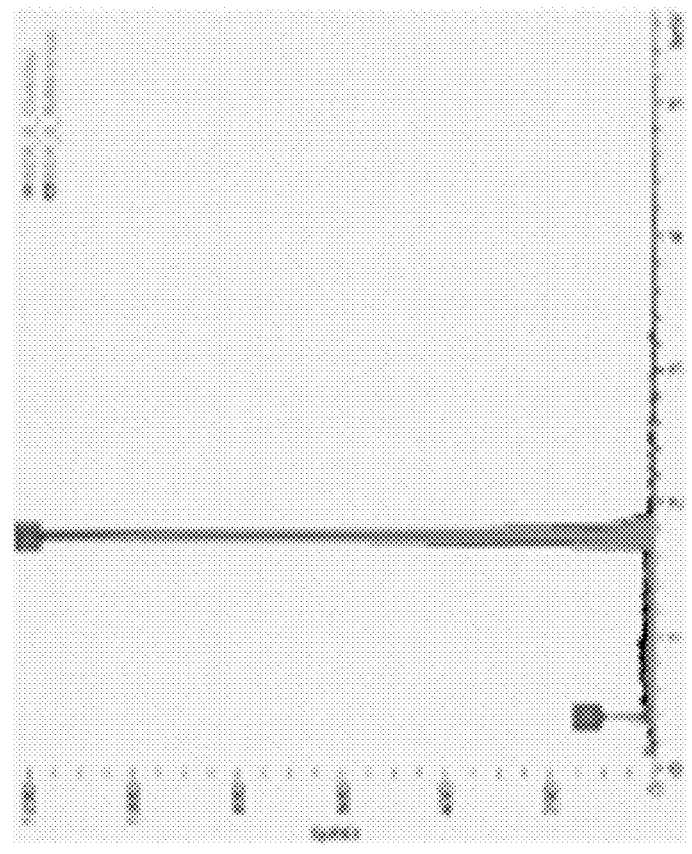
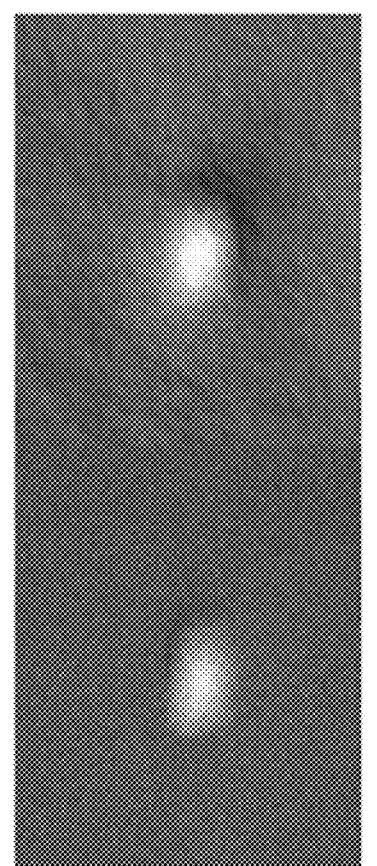
FIG. 14D

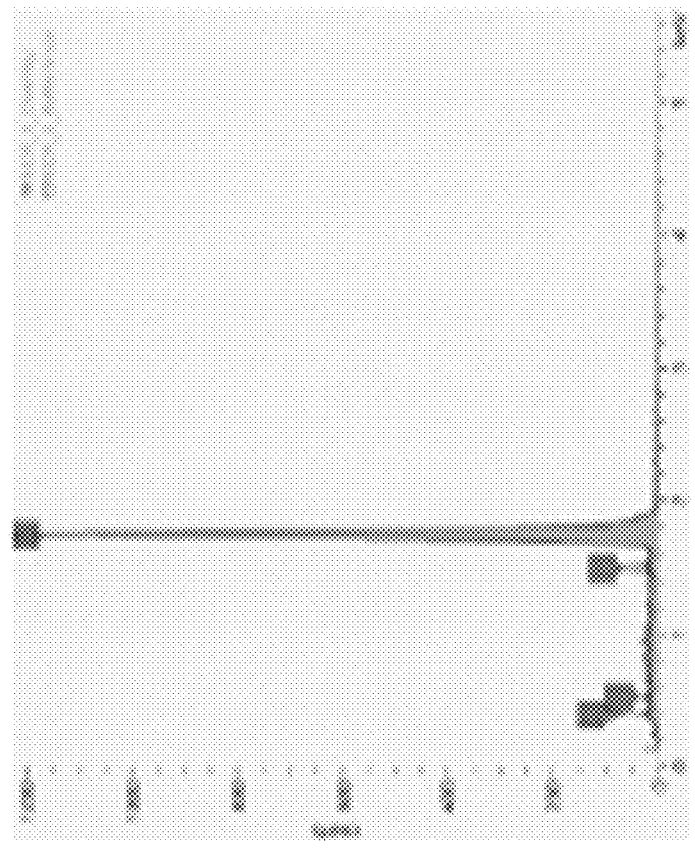
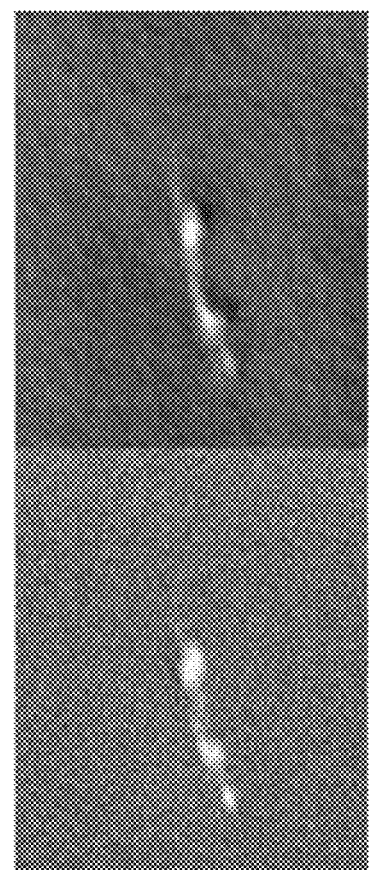
FIG. 16A

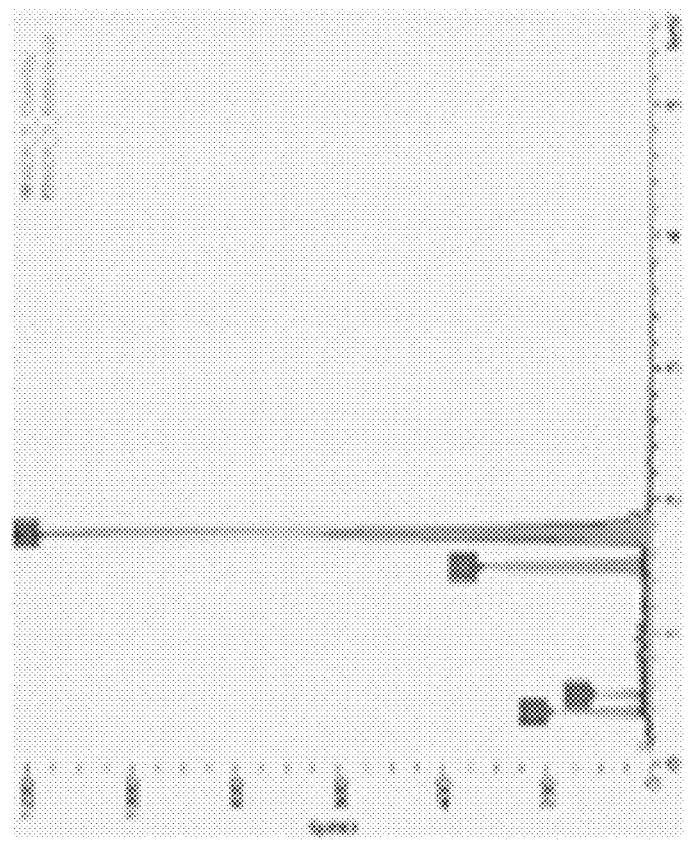
FIG. 16B

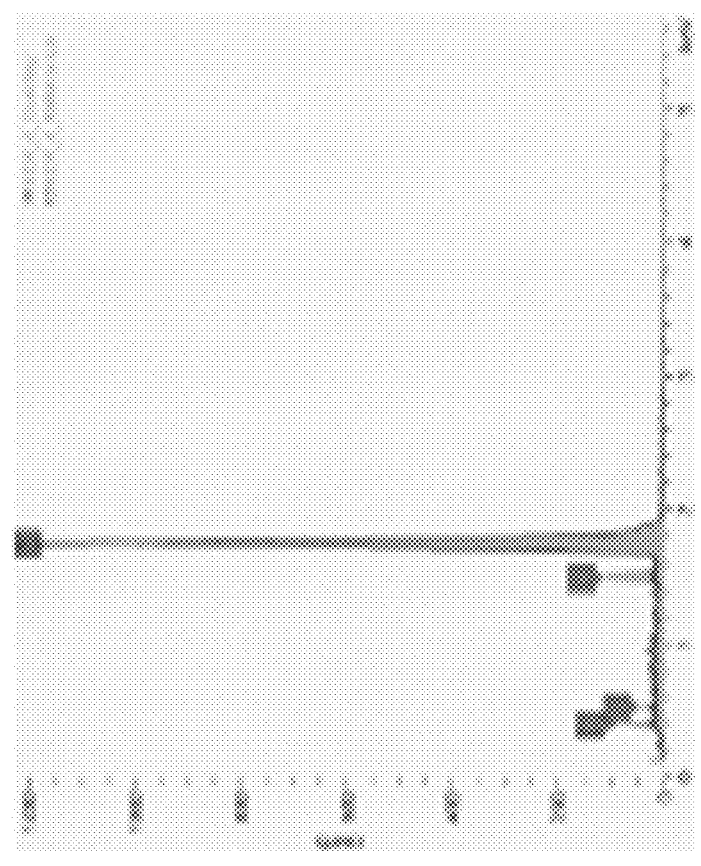
FIG. 16C

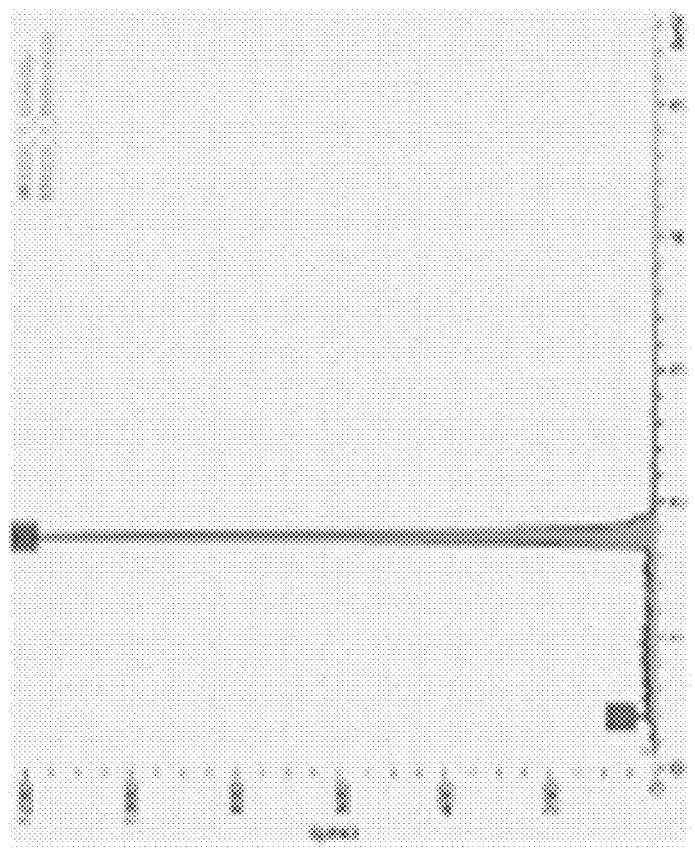
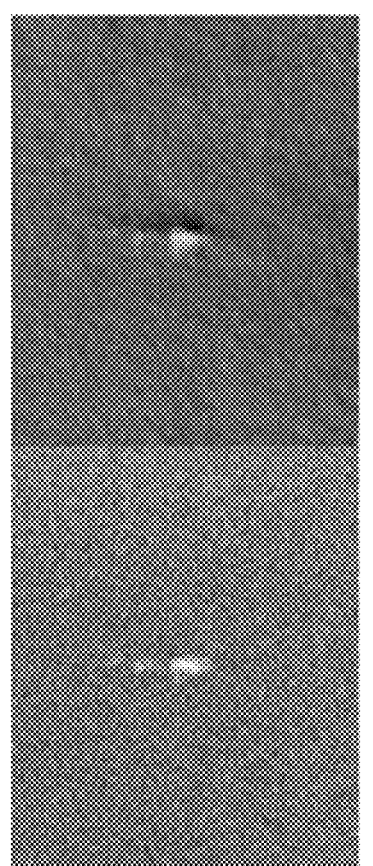
FIG. 16D

METHOD OF REMOVING A BY-PRODUCT FROM A COMPONENT OF A SEMICONDUCTOR APPARATUS

BACKGROUND

Fabrication of a semiconductor integrated circuit (IC) typically involves a complicated process sequence requiring hundreds of individual steps performed on a semiconductor substrate in a variety of processing chambers. For example, a processing chamber is configured to form a thin film on the semiconductor substrate by deposition or reaction. Over time, by-products formed on components of the chamber significantly increase a chance of particle contamination of the semiconductor substrate in the processing chamber. Replacing chamber components significantly increases costs and consumes time. Therefore, there is a need in the art for an improved effect and efficiency of the method of removing the by-products on the chamber components. Improvements in these areas are desired.

BRIEF DESCRIPTION OF THE DRAWINGS

Aspects of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 3 is a flowchart showing various steps of a method of removing a by-product from a component of a semiconductor apparatus in accordance with some embodiments of the present disclosure.

FIGS. 14A to 14D are photomicrographs and element maps illustrating components before and after treatment by a method in accordance with some comparative embodiments.

FIGS. 16A to 16D are photomicrographs and element maps illustrating components before and after treatment by a method in accordance with some comparative embodiments.

DETAILED DESCRIPTION

Figure 1:
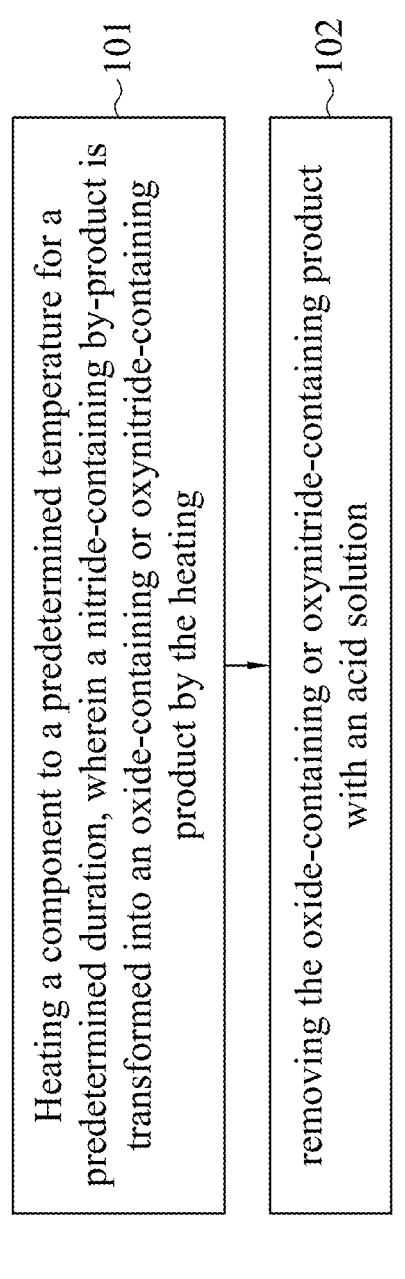
FIG. 1 is a flowchart showing various steps of a method of removing a nitride-containing by-product from a component of a semiconductor apparatus in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A chamber component used in a processing chamber may have an initial porosity and an initial amount of micro-cracking. The porosity and the micro-cracking may enable process gases and cleaning compounds to penetrate a coating or a surface of the processing chamber and react with an underlying material of the processing chamber during processing. Such reactions may generate gases, moisture or a different material under the coating or within the chamber component, which may introduce more micro-cracks formed on the chamber component due to coefficient of thermal expansion of delta ($\alpha$-CTE). Such cracks may cause an elevated amount of particle contamination on processed material (e.g., processed wafers or semiconductor substrates). Further, as the chamber component ages, the more particle contamination it is likely to cause. The method of the present disclosure may be performed on such aged chamber component to reverse damage caused by a corrosive chamber environment. The method of the present disclosure may remove defects and particles from the used chamber components, and may reduce a prevalence of particle generation on newly-manufactured chamber components. Accordingly, the method of the present disclosure may be used to prepare or repair a chamber component and prolong a useful life of the chamber component.

FIG. 1 is a flowchart showing a method 100 of removing a nitride-containing by-product from a component of a semiconductor apparatus in a semiconductor structure in accordance with some embodiments of the present disclosure. The method 100 includes several operations: (101) heating the component to a predetermined temperature and for a predetermined duration, wherein the nitride-containing by-product is transformed into an oxide-containing or oxynitride-containing product by the heating; and (102) removing the oxide-containing or oxynitride-containing product with an acid solution.

Figure 2:
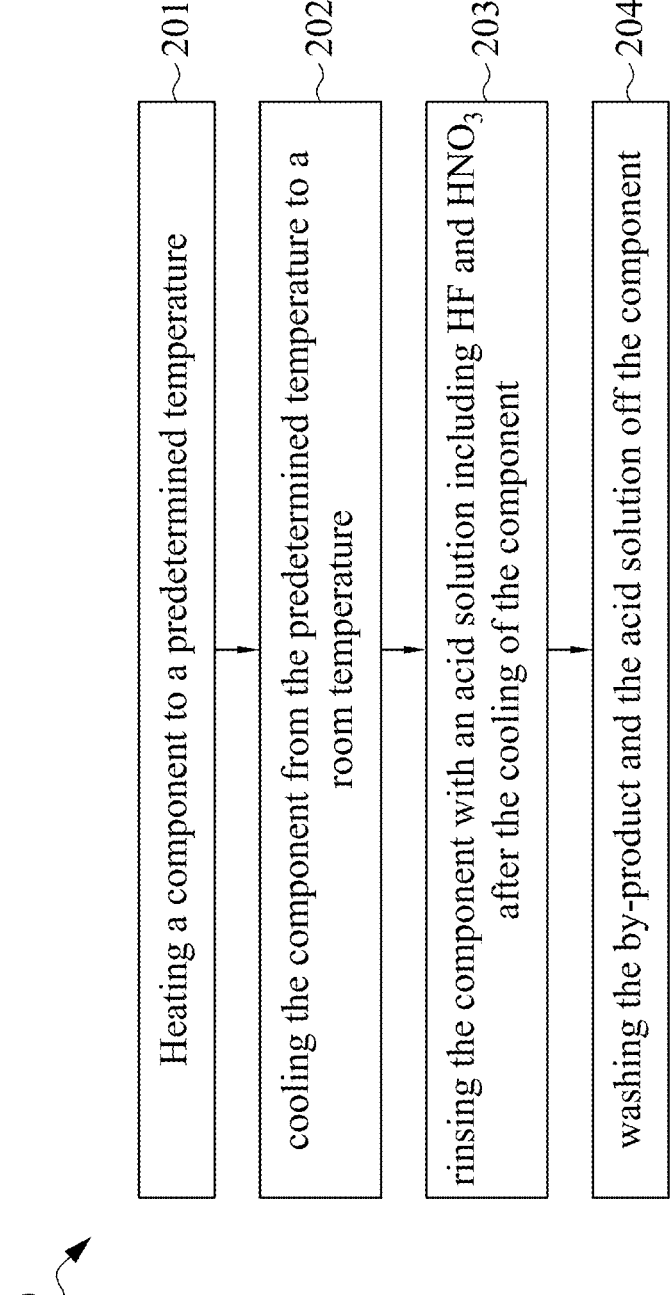
FIG. 2 is a flowchart showing various steps of a method of removing a by-product from a component of a semiconductor apparatus in accordance with some embodiments of the present disclosure.

FIG. 2 is a flowchart showing a method 200 of removing a by-product from a component of a semiconductor apparatus in accordance with some embodiments of the present disclosure. The method 200 includes several operations: (201) heating the component to a predetermined temperature; (202) cooling the component from the predetermined temperature to a room temperature; (203) rinsing the component with an acid solution including HF and $HNO_3$ after the cooling of the component; and (204) washing the by-product and the acid solution off the component.

FIG. 3 is a flowchart showing a method 300 of removing a by-product from a component of a semiconductor apparatus in accordance with some embodiments of the present disclosure. The method 300 includes several operations: (301) providing a component in a chamber, wherein a surface of the component is covered by a by-product; (302) injecting a gas into the chamber; (303) heating the component to cause the by-product to react with the gas to form oxide on the component; (304) rinsing the oxide with an acid solution, wherein the acid solution includes HF and $HNO_3$; and (305) removing the acid solution and the oxide from the component to expose the surface of the component.

In order to illustrate concepts and the methods 100, 200 and 300 of the present disclosure, various embodiments are provided below. However, the present disclosure is not intended to be limited to specific embodiments. In addition, elements, conditions or parameters illustrated in different embodiments can be combined or modified to form different combinations of embodiments as long as the elements, parameters or conditions used are not in conflict. For ease of illustration, reference numerals with similar or same functions and properties are repeated in different embodiments and figures.

Figure 4:
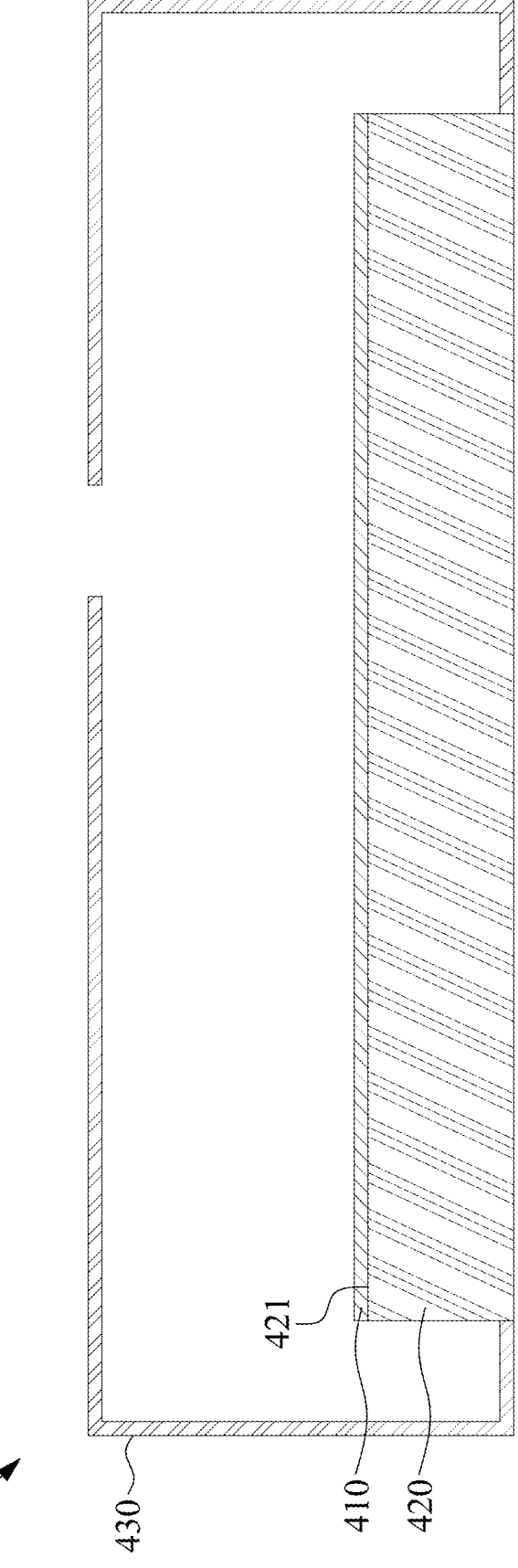
FIGS. 4 to 12 are schematic diagrams illustrating exemplary operations in a method of removing a by-product from a component of a semiconductor apparatus, in accordance with some embodiments of the present disclosure.

FIGS. 4 to 12 are schematic views of one or more stages of the methods 100, 200 and 300 of removing a by-product 410 from a component 420 of a semiconductor apparatus in accordance with some embodiments of the present disclosure. The nitride-containing by-product 410 formed on the component 420 of the semiconductor apparatus of the method 100, the by-product 410 formed on the component 420 of the semiconductor apparatus of the method 200, or operation 301 of the method 300 in accordance with some embodiments of the present disclosure is illustrated in FIG. 4.

The component 420, with the by-product 410 thereon, is provided or received as shown in FIG. 4. In some embodiments, referring to FIG. 4, in operation 301 of the method 300, the component 420 is provided in a chamber 430, wherein a surface 421 of the component 420 is at least partially covered by the by-product 410. In some embodiments, the by-product 410 is a nitride-containing by-product 410. In some embodiments, the nitride-containing by-product 410 includes aluminum.

In some embodiments, the component 420 is used in a semiconductor apparatus such as a non-plasma etcher, a non-plasma cleaner, a chemical vapor deposition (CVD) chamber, a physical vapor deposition (PVD) chamber, a plasma-enhanced chemical vapor deposition (PECVD) chamber, a plasma-enhanced physical vapor deposition (PEPVD) chamber, a plasma-enhanced atomic layer deposition (PEALD) chamber, or the like. In some embodiments, the component 420 is a showerhead, an RF housing, or an electrode plate of an atomic layer deposition (ALD) tool. In some embodiments, the component 420 includes aluminum, stainless steel, ceramic, nickel, ceramic, quartz, or combinations thereof.

In some embodiments, the component 420 is disposed in the chamber 430. In some embodiments, a furnace 440 including the chamber 430 is provided. The chamber 430 is capable of applying a controlled temperature on the components 420 inserted therein. In some embodiments, the chamber 430 is a thermally insulated chamber and may be hermetically sealed. The furnace 440 may include a pump configured to pump air out of the chamber 430 and thus create a vacuum within the chamber 430. In addition, the furnace 440 may include a gas inlet 431 in communication with the chamber 430 to pump gases, such as argon, nitrogen, helium, etc., into the chamber 430. The furnace 440 may be capable of performing a predefined process, which controls heating rate, cooling rates, process times, temperatures, pressure, gas flows and the like.

Figure 5:
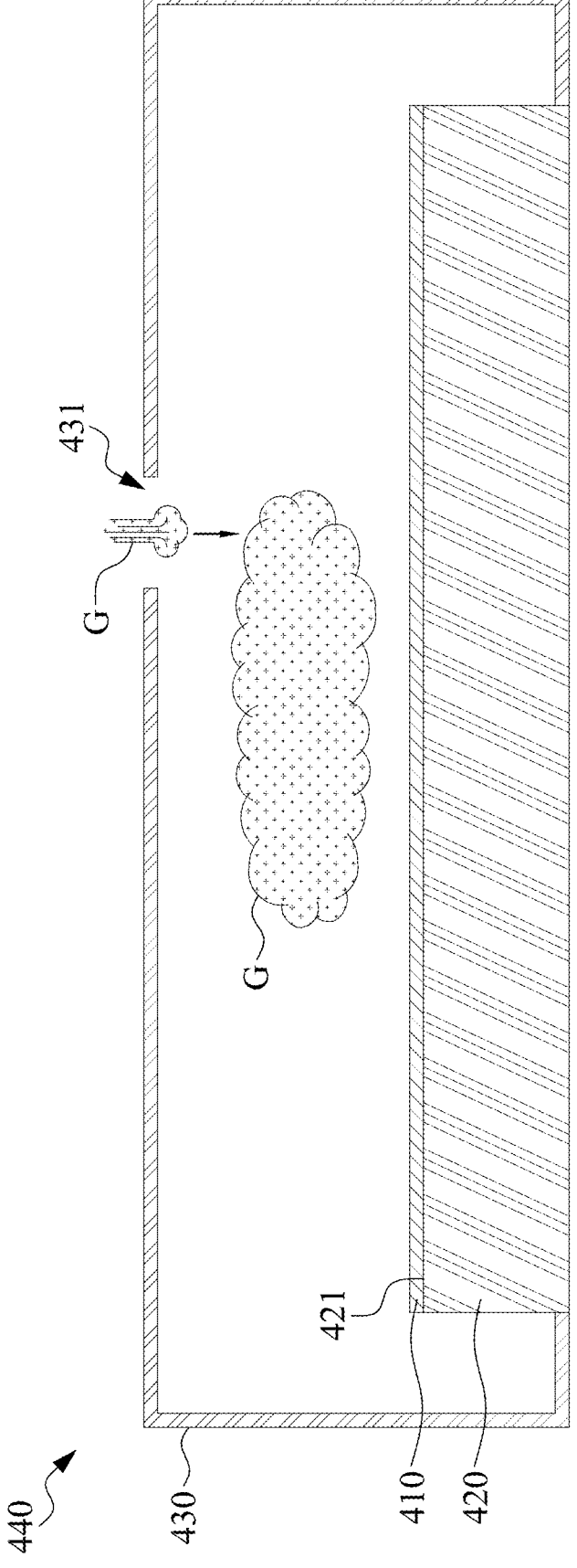

FIG. 5 is a schematic view illustrating operation 302 of the method 300 in accordance with some embodiments of the present disclosure. In some embodiments, referring to FIG. 5, in operation 302 of the method 300, a gas G is injected into the chamber 430. In some embodiments, the gas G is in contact with the by-product 410. In some embodiments, the gas G includes air or nitrogen. In some embodiments, the gas G is configured to oxidize the by-product 410. In some embodiments, the method 100 and the method 200 further include providing the gas G in contact with the by-product 410. In some embodiments, the gas G is injected into the chamber 430 through the inlet 431. In some embodiments, the chamber 430 has an oxidizing environment formed therein after the injection of the gas G.

Figure 6:
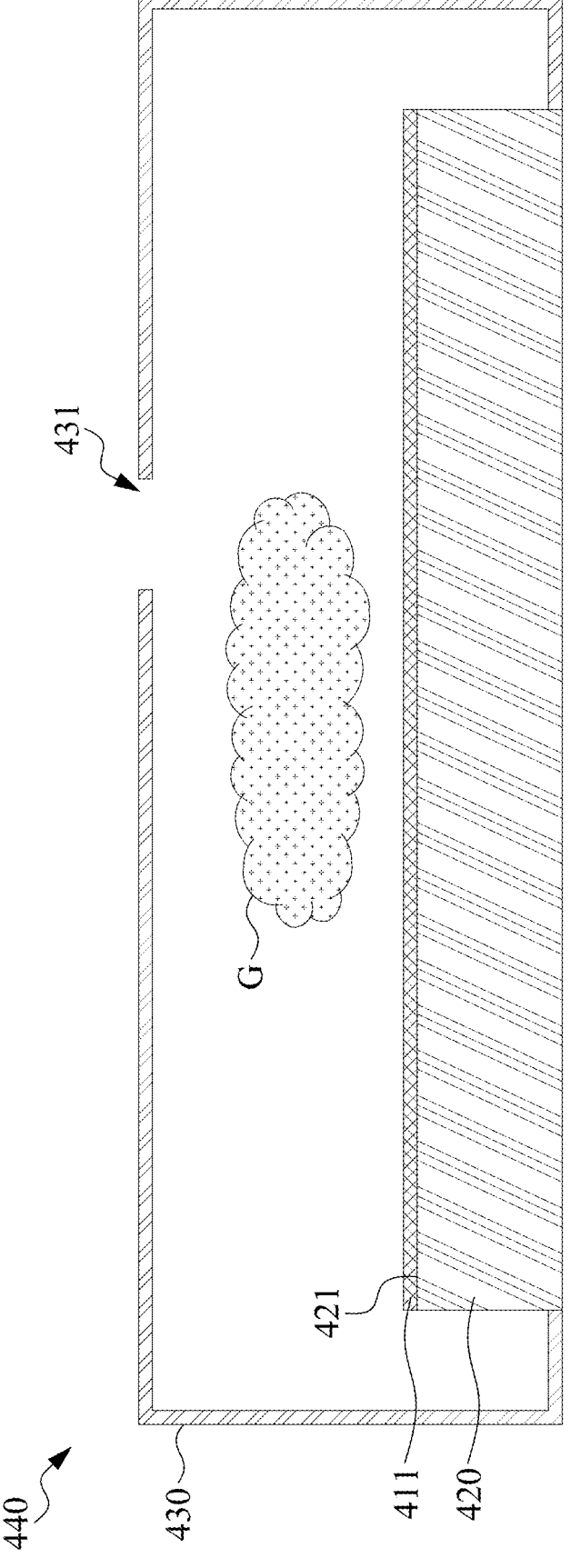

FIG. 6 is a schematic view illustrating operation 101 of the method 100, operations 201 and 202 of the method 200, or operation 303 of the method 300 in accordance with some embodiments of the present disclosure. In operation 101, in some embodiments, referring to FIG. 6, the component 420 is heated to a predetermined temperature for a predetermined duration, wherein the nitride-containing by-product 410 is transformed into an oxide-containing or oxynitride-containing product 411 (which is also a by-product) by the heating. In operation 201, in some embodiments, the component 420 is heated to the predetermined temperature. In some embodiments, the heating includes oxidizing the nitride-containing by-product 410 to form the oxide-containing or oxynitride-containing product 411. In operation 303, the component 420 is heated to cause the by-product 410 to react with the gas G to form oxide or oxynitride on the component 420. In some embodiments, the oxide or oxynitride on the component 420 is the oxide-containing or oxynitride-containing product 411. In some embodiments, the injection of the gas G into the chamber 430 and the heating of the component 420 are performed simultaneously.

In some embodiments, the component 420 is heated in the chamber 430 including the gas G. In some embodiments, the component 420 and the by-product 410 undergo a heat treatment. The heat treatment may be performed by heating the by-product 410 formed on the component 420 in the furnace 440 including the gas G. Other heat treatment techniques that may be used include a laser surface treatment (also referred to as a laser heat treatment), an electron beam (e-beam) surface treatment (also referred to as an e-beam heat treatment), a flame surface treatment (also referred to as a flame heat treatment), and a high-temperature plasma treatment. In some embodiments, the by-product 410 and the component 420 may be thermally treated in the chamber 430 of the furnace 440 in an ambient air environment, which may be an oxidizing environment of the by-product 410. In some embodiments, the by-product 410 and the component 420 may be thermally treated in the chamber 430 of the furnace 440 in a non-oxidizing environment. For example, nitrogen, helium, argon, or combinations thereof may be provided to the chamber 430 of the furnace 440 to create a non-oxidizing environment to prevent oxidization of the component 420.

In some embodiments, the predetermined temperature is between 100° C. and 1,000° C. In some embodiments, a heating rate of the heating of the component 420 is between 0.5° C./min and 100° C./min. The component 420 may be fragile, and may crack when exposed to extreme changes in temperature. The temperature changes that cause the component 420 to crack may depend on the composition of the component 420. Accordingly, the heating rate of the heating of the component 420 is slow enough to prevent the component 420 from cracking or otherwise losing structural integrity. In some embodiments, a heating rate of less than 100° C./min that does not cause cracking may be utilized. In some embodiments, the component 420 starts at or near the ambient temperature and is slowly heated at the heating rate to the predetermined temperature. In some embodiments, the component 420 is thermally treated at one or more predetermined temperatures within the predetermined temperature range.

In some embodiments, when the component 420 includes aluminum, the predetermined temperature is between 100° C. and 400° C. In some embodiments, when the component 420 includes aluminum, the heating rate of the heating of the component 420 is between 0.5° C./min and 100° C./min. In some embodiments, when the component 420 includes stainless steel, the predetermined temperature is between 100° C. and 900° C. In some embodiments, when the component 420 includes stainless steel, the heating rate of the heating of the component 420 is between 0.5° C./min and 100° C./min. In some embodiments, when the component 420 includes nickel, the predetermined temperature is between 100° C. and 900° C. In some embodiments, when the component 420 includes nickel, the heating rate of the heating of the component 420 is between 0.5° C./min and 100° C./min. In some embodiments, when the component 420 includes ceramic, the predetermined temperature is between 100° C. and 1,000° C. In some embodiments, when the component 420 includes ceramic, the heating rate of the heating of the component 420 is between 0.5° C./min and 10° C./min. In some embodiments, when the component 420 includes quartz, the predetermined temperature is between 100° C. and 1,000° C. In some embodiments, when the component 420 includes quartz, the heating rate of the heating of the component 420 is between 0.5° C./min and 100° C./min. In some embodiments, the predetermined temperature is 350° C.

In some embodiments, the component 420 is thermally treated within the predetermined temperature range for a predetermined duration between 0.5 hours and 72 hours. In some embodiments, the predetermined duration is between 2 and 36 hours, such as 24 hours. The specific duration utilized may depend on a composition of the component 420, as well as the desired performance properties of the component 420. In some embodiments, the component 420 is maintained at a single predetermined temperature for the predetermined duration of the thermal treatment. Alternatively, the component 420 may be heated and/or cooled within the predetermined temperature range during the thermal treatment. In some embodiments, the component 420 may be thermally treated at a first predetermined temperature for a first predetermined duration and may then be thermally treated at a second predetermined temperature for a second predetermined duration. When multiple different thermal treatment temperatures are utilized, the component 420 may be heated and/or cooled at the predetermined heating rates to transition between the first and second predetermined temperatures. In some embodiments, the predetermined temperature and/or predetermined duration for heating the component 420 being used may be different from a predetermined temperature and/or a predetermined duration used when the component 420 was newly manufactured.

In some embodiments, in operation 202 of the method 200, the component 420 is cooled from the predetermined temperature to a room temperature. In some embodiments, after the oxide-containing or oxynitride-containing product 411 is formed, the component 420 is cooled to the room temperature. In some embodiments, after the oxide-containing or oxynitride-containing product 411 is formed, the component 420 is cooled to below 50° C. In some embodiments, a cooling rate of the cooling of the component 420 is between 0.5° C./min and 100° C./min. In some embodiments, the cooling rate of the cooling of the component 420 including aluminum, stainless steel, nickel or quartz is between 0.5° C./min and 100° C./min. In some embodiments, the cooling rate of the cooling of the component 420 including ceramics is between and 20° C./min. In some embodiments, the component 420 is cooled at a cooling rate that is equivalent to a heating rate used to heat the component 420. In some embodiments, the component 420 is cooled at a cooling rate that is different from a heating rate that was utilized to heat the component 420.

Figure 7:
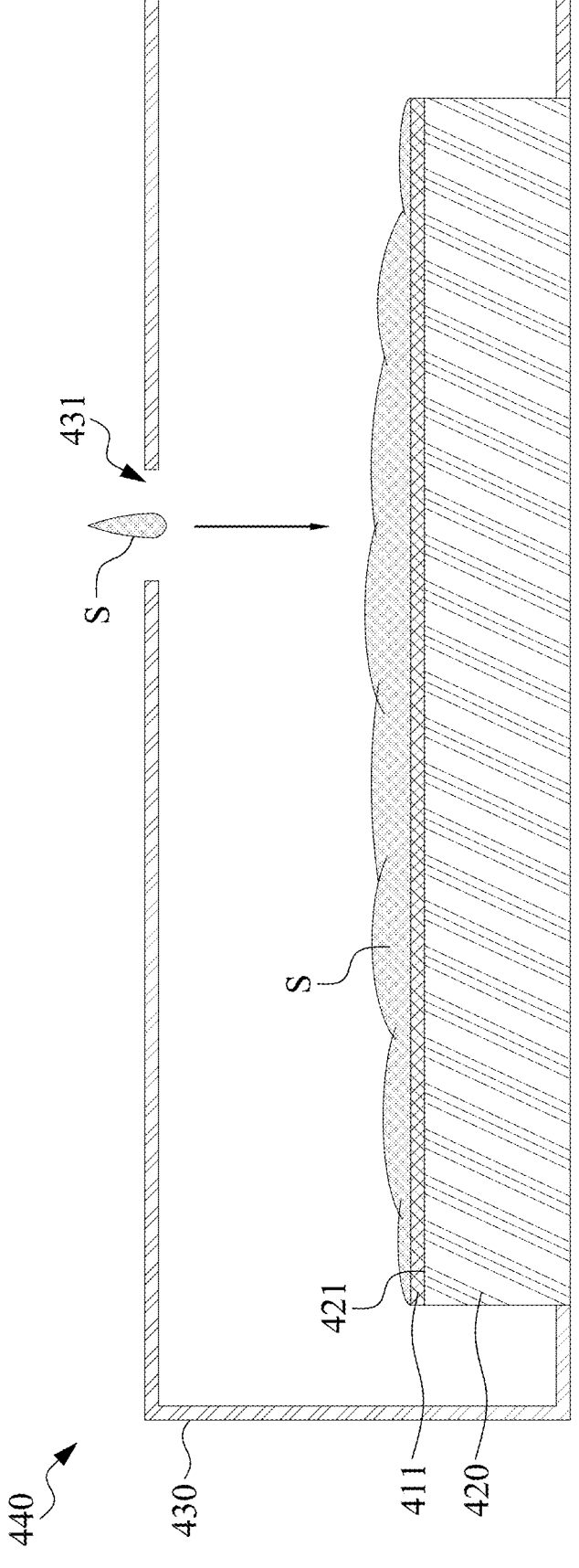
Figure 8:
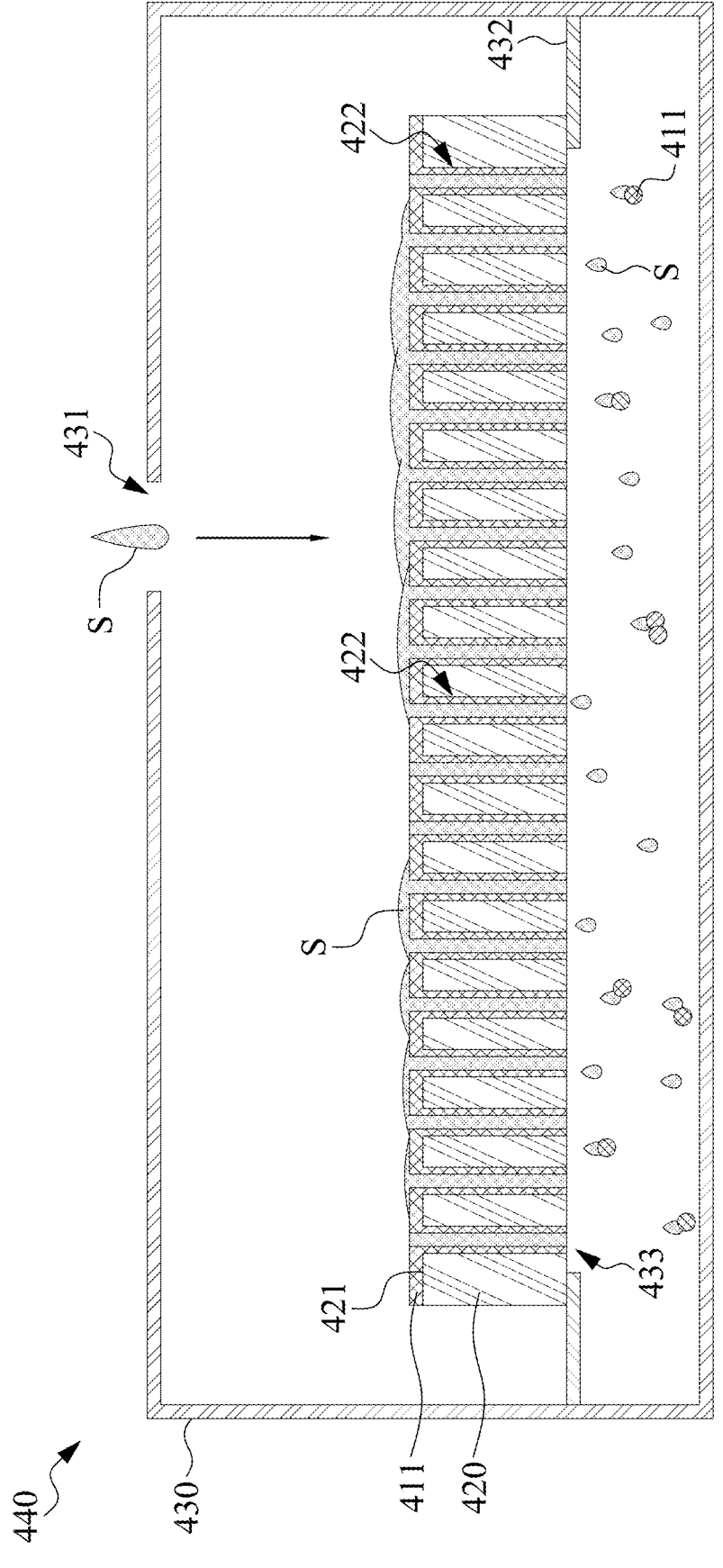

FIGS. 7 and 8 are schematic views illustrating operation 102 of the method 100, operation 203 of the method 200, or operation 304 of the method 300 in accordance with some embodiments of the present disclosure. In operation 102, in some embodiments, referring to FIG. 7, the oxide-containing or oxynitride-containing product 411 is removed by an acid solution S. In some embodiments, the acid solution S includes HF and $HNO_3$. In some embodiments, the oxide-containing or oxynitride-containing product 411 is rinsed by the acid solution S. In operation 203, in some embodiments, the component 420 is rinsed with the acid solution S including HF and $HNO_3$ after the cooling of the component 420. In operation 304, in some embodiments, the oxide 411 is rinsed with the acid solution S, wherein the acid solution S includes HF and $HNO_3$.

In some embodiments, the acid solution S is less likely to react with nitrides such as the by-product 410 and more likely to react with the oxide-containing or oxynitride-containing product 411. Therefore, the methods 100, 200 and 300 include transforming the nitride-containing by-product 410 to the oxide-containing or oxynitride-containing product 411, and causing the oxide-containing or oxynitride-containing product 411 to react with the acid solution S. In song; embodiments, at least a portion of the oxide-containing or oxynitride-containing product 411 dissolves in the acid solution S. In some embodiments, a portion of the oxide-containing or oxynitride-containing product 411 is washed away by the acid solution S.

In some embodiments, the acid solution S includes 0.1 to 20 wt % HF and 0.1 to 40 wt % $HNO_3$. In some embodiments, the acid solution S includes 2 wt % HF and 10 wt % $HNO_3$. In some embodiments, the acid solution S further includes a compound selected from a group consisting of $H_2O_2$, $H_2SO_4$, $H_3PO_4$, HCl, and combinations thereof. In some embodiments, the acid solution S further includes a compound selected from a group consisting of 0 wt % to 20 wt % $H_2O_2$, 0 wt % to 20 wt % $H_2SO_4$, 0 wt % to 40 wt % $H_3PO_4$, 0 wt % to 20 wt % HCl, and combinations thereof.

In some embodiments, the oxide-containing or oxynitride-containing product 411 is rinsed with the acid solution S for less than 1 hour. In some embodiments, the oxide-containing or oxynitride-containing product 411 is rinsed with the acid solution S for less than 3 minutes. In some embodiments, the acid solution S is injected into the chamber 430 through the inlet 431. In some embodiments, the gas G and the acid solution S are both in the chamber 430. In some embodiments, the gas G is discharged from the chamber 430 when the acid solution S is injected into the chamber 430. In some embodiments, the component 420 is moved to another chamber (not shown) and rinsed with the acid solution S in another chamber.

In some embodiments, referring to FIG. 8, the component 420 such as a showerhead or an RF housing includes a through hole 422 extending through the component 420. In some embodiments, the component 420 includes a plurality of the through holes 422. In some embodiments, each of the through holes 422 has a diameter less than 0.1 cm. In some embodiments, in addition to forming on the surface 421 of the component 420, the oxide-containing or oxynitride-containing product 411 converted from the by-product 410 also forms in the through holes 422. In some embodiments, the acid solution S is injected into the through holes 422 to react with the oxide-containing or oxynitride-containing product 411 disposed in the through holes 422.

In some embodiments, the component 420 is disposed on a platform 432 having an opening 433. In some embodiments, at least a portion of the acid solution S flows out of the through holes 422 and into the opening 433. In some embodiments, the acid solution S flowing out of the through holes 422 and into the opening 433 includes the oxide-containing or oxynitride-containing product 411 dissolved therein.

In some embodiments, a pump (not shown) is used to pump the acid solution S into the through holes 422 of the component 420. In some embodiments, a positive pressure is applied to the component 420 to push the acid solution S out of the through holes 422. In some embodiments, a negative pressure is provided adjacent to the through holes 422 of the component 420 to pull the acid solution S out of the through holes 422.

Figure 9:
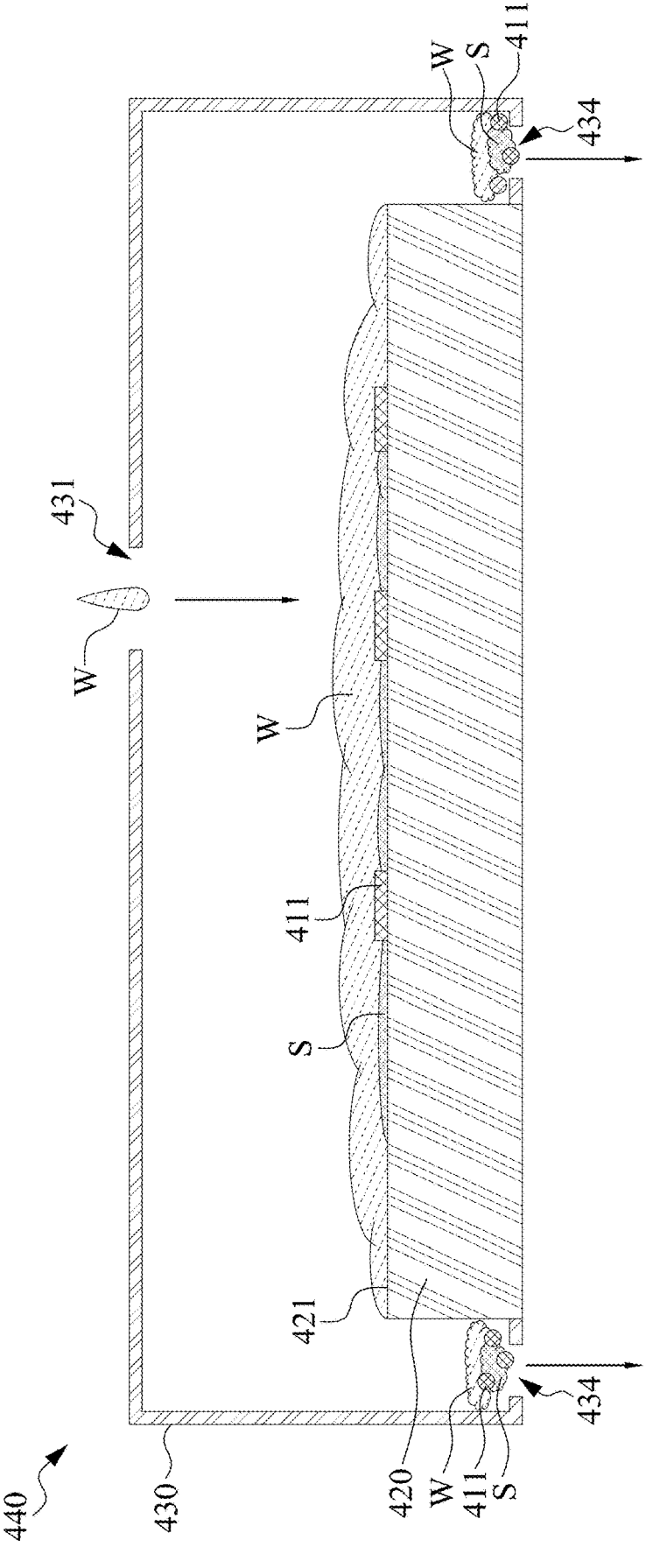
Figure 10:
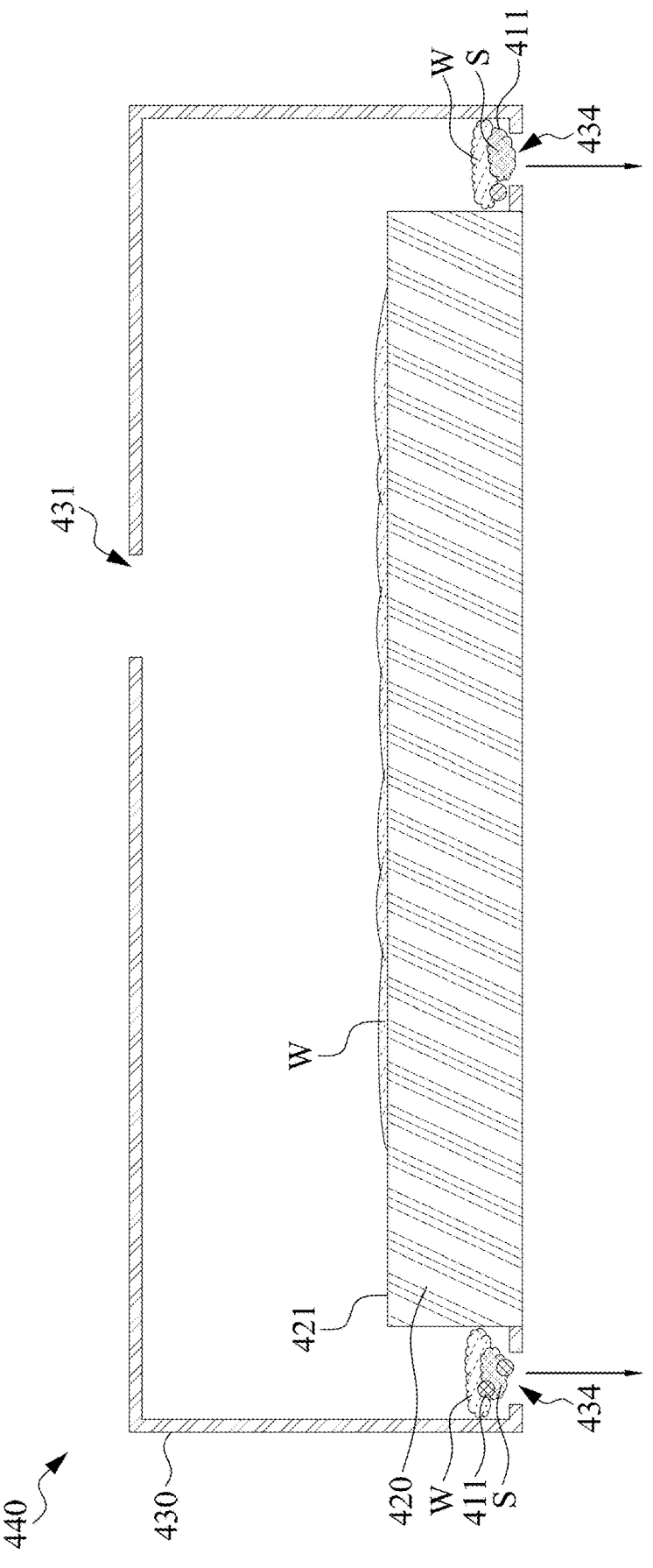

FIGS. 9 and 10 are schematic views illustrating operation 204 of the method 200 or operation 305 of the method 300 in accordance with some embodiments of the present disclosure. In operation 204, in some embodiments, referring to FIGS. 9 and 10, the by-product 411 and the acid solution S are washed off the component 420. In operation 305, in some embodiments, the acid solution S and the oxide 411 are removed from the component 420 to expose the surface 421 of the component 420. In some embodiments, after operation 102, the method 100 further includes washing the component 420 after the removal of the oxide-containing or oxynitride-containing product 411. In some embodiments, the oxide 411 and the acid solution S are washed off the component 420 by deionized water W.

In some embodiments, the deionized water W has a temperature of 35° C. to 60° C. The oxide-containing or oxynitride-containing product 411 is more soluble in deionized water W having a temperature of 35° C. to 60° C. than in the deionized water W at room temperature. In some embodiments, the deionized water W has a temperature of 40° C. to 50° C. In some embodiments, the component 420 is rinsed in the deionized water W for 5 to 30 minutes. In some embodiments, an ultrasonic power is applied to the deionized water W. In some embodiments, the ultrasonic power is applied to the deionized water W for 5 to 30 minutes. In some embodiments, the deionized water W is pressurized and sprayed on the component 420.

In some embodiments, the deionized water W is injected into the chamber 30 through the inlet 431. In some embodiments, the acid solution S, the by-product 410 (if any), the oxide-containing or oxynitride-containing product 411, and/or some deionized water W are discharged from the chamber 430 through an outlet 434 in communication with the chamber 430. In some embodiments, the acid solution S, the by-product 410 (if any), the oxide-containing or oxynitride-containing product 411, and/or some deionized water W are discharged from the chamber 430 through a plurality of outlets 434.

Figure 11:
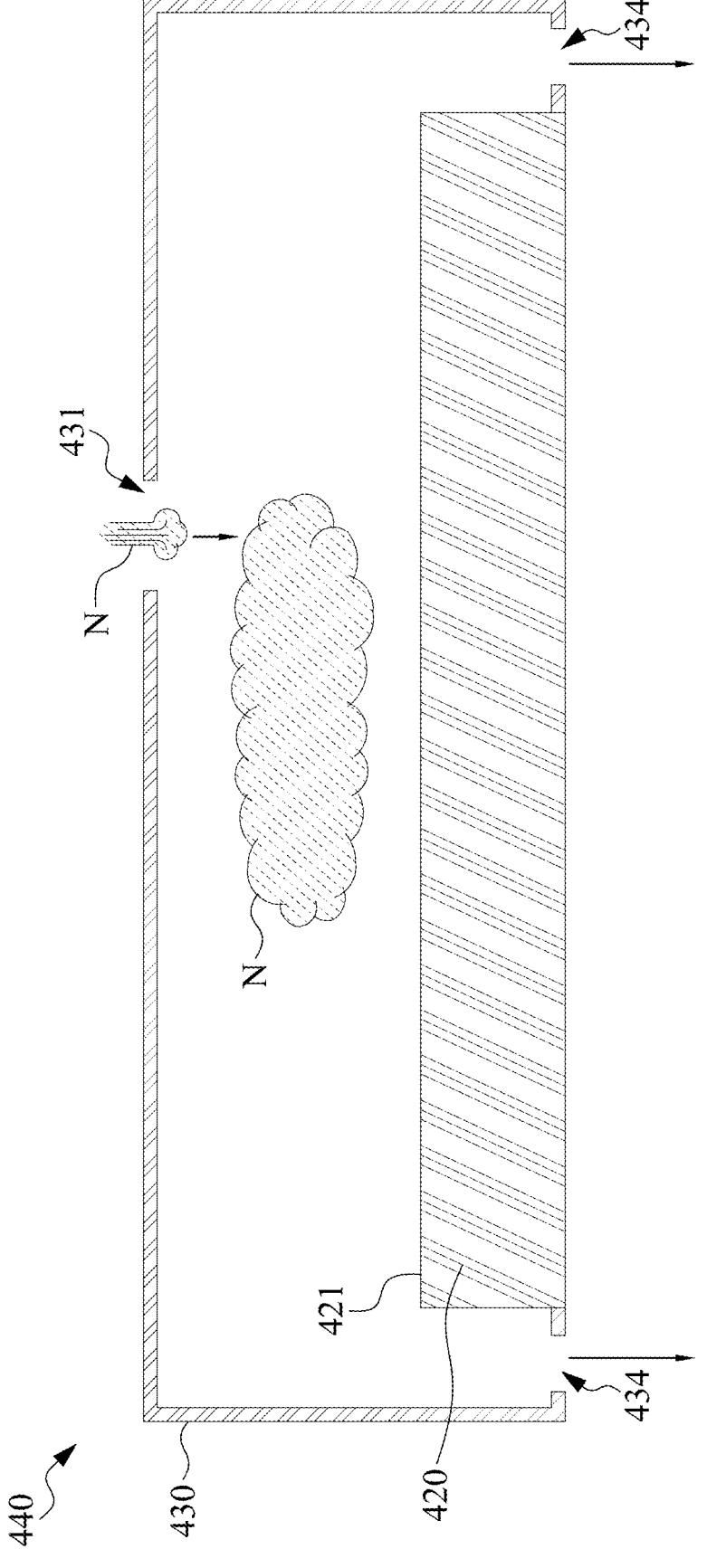
Figure 12:
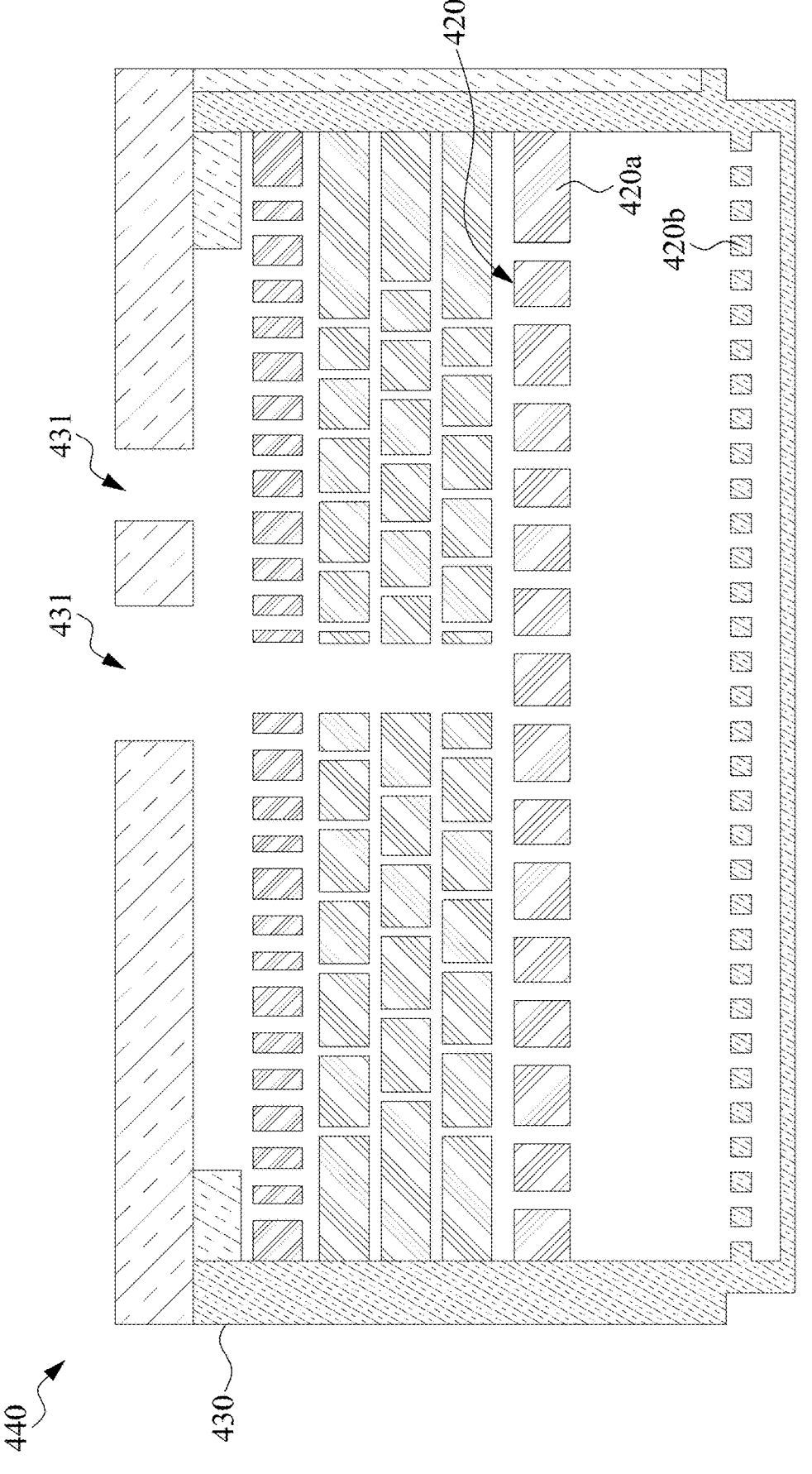

In some embodiments, referring to FIG. 11, the methods 100, 200 and 300 further include drying the surface S of the component 420. In some embodiments, the component 420 is dried in the chamber 430. In some embodiments, nitrogen N is injected into the chamber 430 through the inlet 431 to dry the component 420. In some embodiments, the methods 100, 200 and 300 further include baking the component 420 after the component 420 is dried. In some embodiments, a temperature of the baking of the component 420 is between 90° C. and 150° C. In some embodiments, a duration of the baking of the component 420 is between 10 and 200 minutes. In some embodiments, the component 420, free of the by-product 410 and the oxide-containing or oxynitride-containing product 411, is removed from the chamber 430 after drying.

In some embodiments, the methods 100, 200 and 300 of the present disclosure may be performed on a plurality of components 420 at a same time. In some embodiments, referring to FIG. 12, a plurality of components 420 are disposed in the chamber 430. In some embodiments, an electrode plate 420a and an RF housing 420b are disposed in the chamber 430. In some embodiments, the chamber 430 includes a plurality of inlets 431.

Figures 13A, 13B:
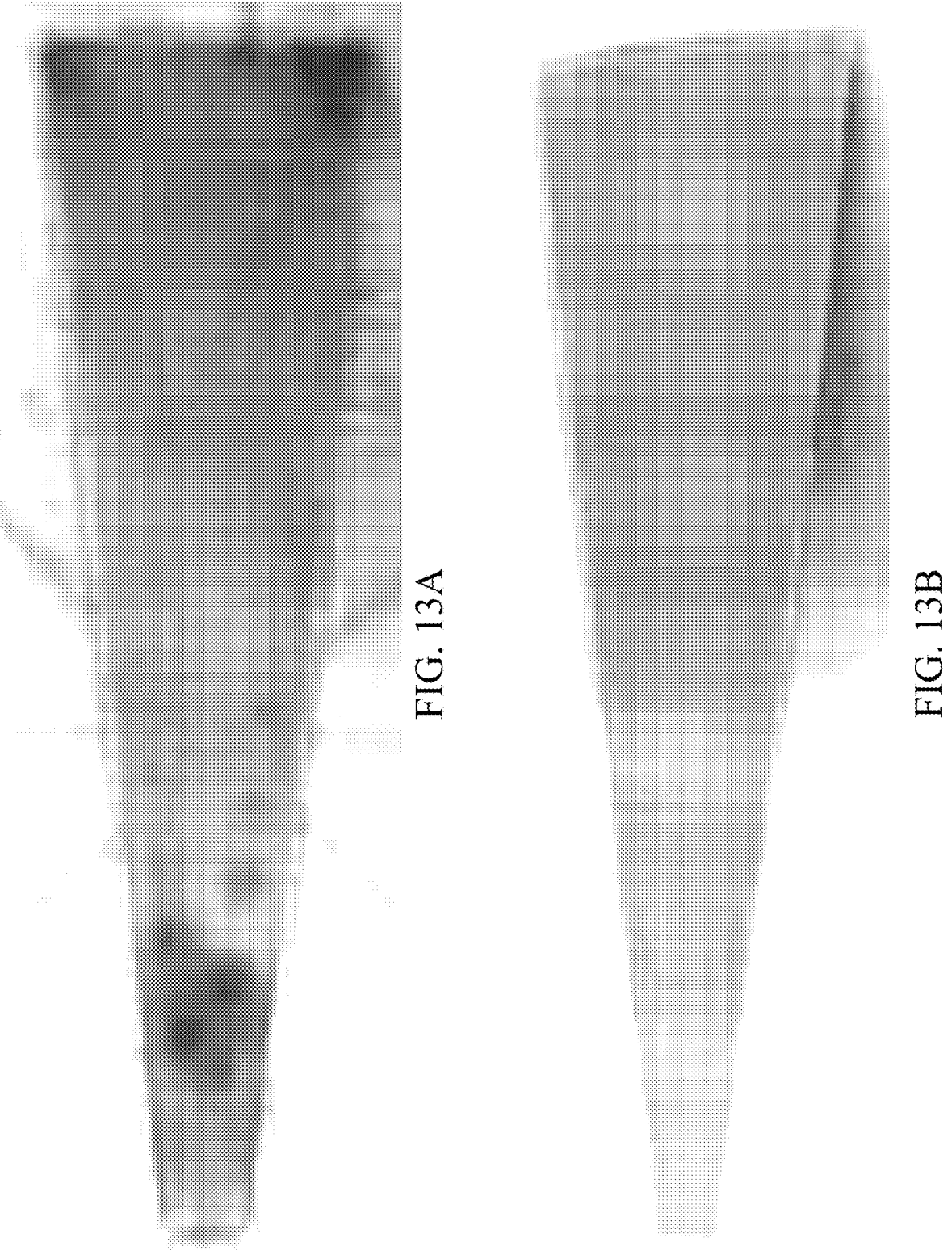
FIGS. 13A and 13B are photographs illustrating components before and after treatment, respectively, by the method in accordance with some embodiments of the present disclosure.

FIGS. 13A and 13B are photographs illustrating a component before and after, respectively, the treatment of the method 100, the method 200 or the method 300 of the present disclosure in accordance with some embodiments of the present disclosure. In some embodiments, referring to FIG. 13A the component 420 is shown before removing the by-product 410. In some embodiments, the component 420 shown in FIG. 13A is an RF housing. The component 420 before removing the by-product 410 includes surface defects and surface particles. In some embodiments, referring to FIG. 13B, the component 420 is shown after removing the by-product 410 by the method 100, the method 200 or the method 300 of the present disclosure is shown. The surface defects shown in FIG. 13B are less severe than the surface defects shown in FIG. 13A, and the surface particles shown in FIG. 13A have been substantially removed in FIG. 13B. In some embodiments, particle counts of the surface 421 of the newly-manufactured component 420 before the removal of the by-product 410 is between 0.5 and 3 ea, and particles counts of the surface 421 of the component 420 after the removal of the by-product 410 by the method 100, the method 200 or the method 300 of the present disclosure are less than 0.4 ea. In some embodiments, a thickness, an etch rate and an RF performance of the newly-manufactured component 420 are the same before and after the processing by the method 100, the method 200 or the method 300 of the present disclosure.

In some comparative embodiments, a method of removing a nitride-containing by-product from a component of a semiconductor apparatus includes removing the nitride-containing by-product using an acid solution including 0.1 to 2.0 wt % HF and 0.1 to 40 wt % $HNO_3$. The component of the comparative embodiments is not heat treated before undergoing a wet acid cleaning with the acid solution.

Figure 15:
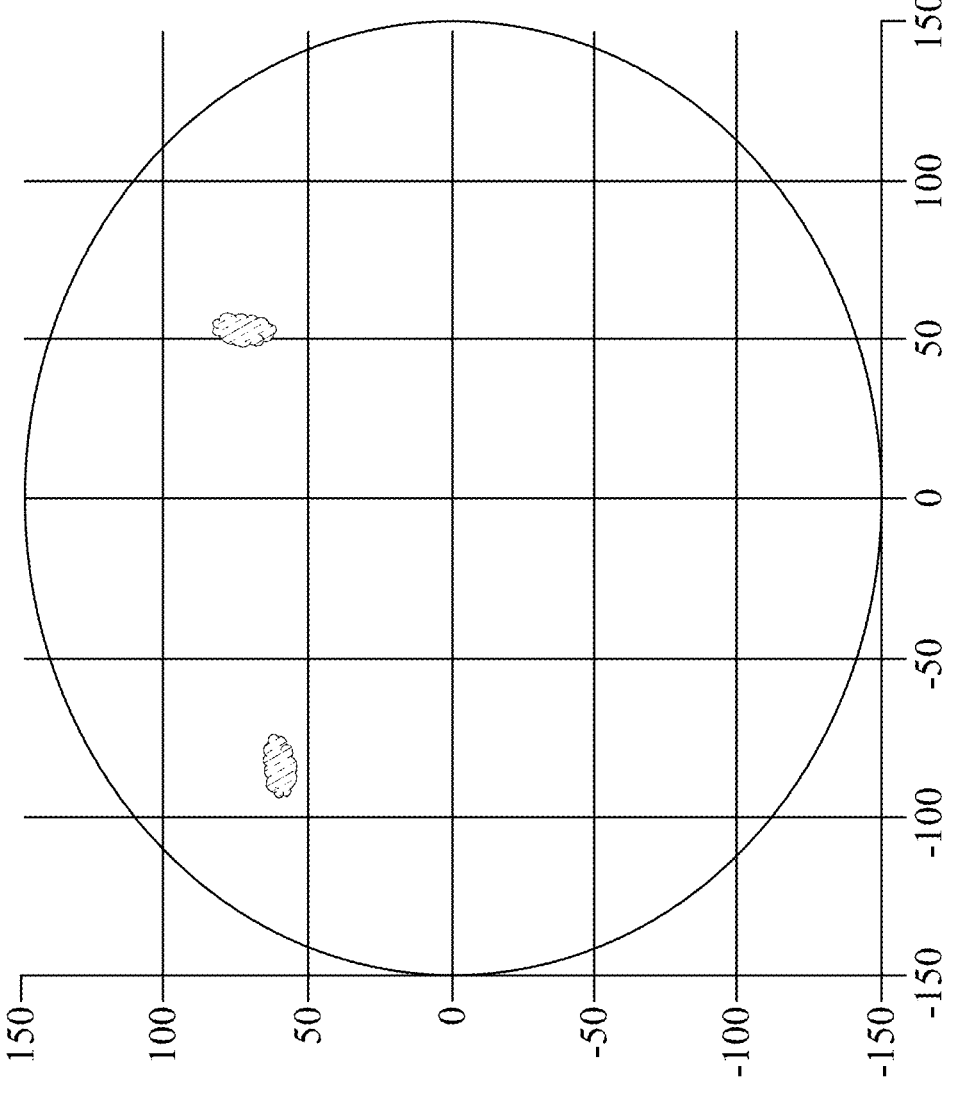
FIG. 15 is a schematic diagram of a wafer processed by a component treated in accordance with some comparative embodiments.

FIGS. 14A to 14D illustrate surface particles of the comparative embodiments before and after the wet acid cleaning. Images of the comparative embodiments before the wet acid cleaning are shown in left columns of FIGS. 14A to 14D. Images of the comparative embodiments after the wet acid cleaning are shown in middle column s of FIGS. 14A to 14D, and elemental maps of the surface particles of the comparative embodiments are shown in right columns of FIGS. 14A to 14D. The elemental maps may provide an elemental analysis of the surface particle shown in the corresponding images based on energy dispersive X-ray spectroscopy (EDX). FIG. 15 is a schematic diagram of a wafer 500 processed by the component 420 of the comparative embodiments.

In some comparative embodiments, the component 420a shown in FIGS. 14A to 14D is an electrode plate. In some comparative embodiments, according to the elemental maps, each of the surface particles shown in FIGS. 14A and NB includes Si, N and Al. The surface particles shown in FIG. 14C include Si, N, O and Al. The surface particles shown in FIG. 14D include Si and N. In some comparative embodiments, referring to FIGS. 14A to 14D, the surface particle issue is not reduced after the wet acid cleaning by the acid solution S without a heat treatment. In some comparative embodiments, compositions of the surface particles predominantly include Al and N. In some comparative embodiments, referring to FIG. 15, because the component 420a still has the surface particles disposed thereon after the wet acid cleaning, the wafer 500 processed by the component 420a of the comparative embodiment has particles 501 falling on it and is contaminated by the particles 501.

Figure 17:
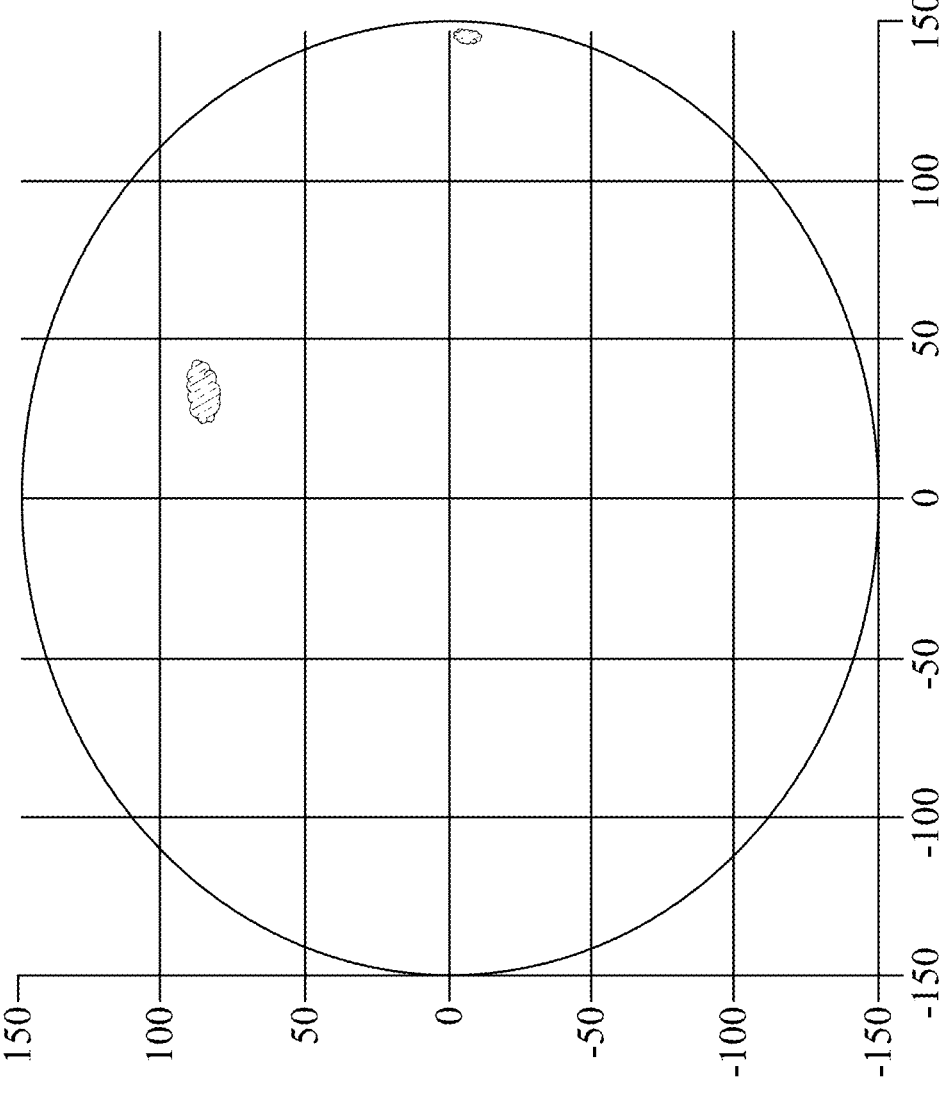
FIG. 17 is a schematic diagram of a wafer processed by a component treated in accordance with some comparative embodiments.

FIGS. 16A to 16D illustrate the surface particles of the comparative embodiments before and after the wet acid cleaning. Images of the comparative embodiments before the wet acid cleaning are shown in left columns of FIGS. 16A to 16D, Images of the comparative embodiments after the wet acid cleaning are shown in middle columns of FIGS. 16A to 16D, and elemental maps of the surface particles of the comparative embodiments are shown in right columns of FIGS. 16A to 16D. The elemental maps may provide an elemental analysis of the surface particles shown in the corresponding images based on energy dispersive X-ray spectroscopy (EDX). FIG. 17 is a schematic diagram of a wafer 700 processed by the component 420 of the comparative embodiment.

In some comparative embodiments, the component 420b shown in FIGS. 16A to 16D is an RF housing. In some comparative embodiments, according to the elemental maps, each of the surface particles shown in FIGS. 16A to 16C includes Si, N, O and Al. The surface particles shown in FIG. 16D include Si and N. In some comparative embodiments, referring to FIGS. 16A to 16B, the surface particle issue is not reduced after the wet acid cleaning without the heat treatment. In some comparative embodiments, compositions of the surface particles are predominantly Al and N. In some comparative embodiments, referring to FIG. 17, because the component 420b still has surface particles disposed thereon after the wet acid cleaning, the wafer 700 processed by the component 420b of the comparative embodiment has particles 701 falling on it and is contaminated by the particles 701.

Some embodiments of the present disclosure provide a method of removing a nitride-containing by-product from a component of a semiconductor apparatus. The method includes: heating the component to a predetermined temperature for a predetermined duration, wherein the nitride-containing by-product is transformed into an oxide-containing or oxynitride-containing product by the heating; and removing the oxide-containing or oxynitride-containing product by an acid solution.

In some embodiments, the nitride-containing by-product includes aluminum. In some embodiments, the acid solution includes and $HNO_3$. In some embodiments, the acid solution includes 0.1 to 20 wt % HF and 0.1 to 40 wt % $HNO_3$. In some embodiments, the component includes aluminum, stainless steel, nickel, ceramic, quartz, or combinations thereof. In some embodiments, the heating includes oxidizing the nitride-containing by-product to form the oxide-containing or oxynitride-containing product. In some embodiments, the method further includes washing the component after the removal of the oxide-containing or oxynitride-containing product.

Some embodiments of the present disclosure provide a method of removing a by-product from a component of a semiconductor apparatus. The method includes: heating the component to a predetermined temperature; cooling the component from the predetermined temperature to a room temperature; rinsing the component with an acid solution including HF and $HNO_3$ after the component is cooled; and washing the by-product and the acid solution off the component.

In some embodiments, the component is heated in a chamber including air or nitrogen. In some embodiments, the acid solution further includes a compound selected from a group consisting of $H_2O_2$, $H_2SO_4$, $H_3PO_4$, HCl, and combinations thereof. In some embodiments, the by-product and the acid solution are washed off with deionized water having a temperature of 35° C. to 60° C. In some embodiments, the method further includes applying an ultrasonic power to the deionized water. In some embodiments, the component is a showerhead, an RF housing, or an electrode plate of an atomic layer deposition (ALD) tool. In some embodiments, the predetermined temperature is between 100° C. and 1,000° C. In some embodiments, a heating rate of the heating of the component is between 0.5° C./min and 100° C./min. In some embodiments, a cooling rate of the cooling of the component is between 0.5° C./min and 100° C./min.

Some embodiments of the present disclosure provide a method of removing a by-product from a component of a semiconductor apparatus. The method includes: providing the component in a chamber, wherein a surface of the component is covered by the by-product; injecting a gas into the chamber; heating the component to cause the by-product to react with the gas to form oxide on the component; rinsing the oxide with an acid solution, wherein the acid solution includes HF and HNO₃; and removing the acid solution and the oxide from the component to expose the surface of the component.

In some embodiments, the by-product includes nitride, and the gas includes air or nitrogen. In some embodiments, the acid solution and the oxide are removed from the component by washing the component with deionized water. In some embodiments, the method further includes drying the surface of the component in the chamber.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of removing a nitride-containing by-product from a component of a semiconductor apparatus, comprising:
   heating the component to a predetermined temperature for a predetermined duration, wherein the nitride-containing by-product is transformed into an oxide-containing or oxynitride-containing product by the heating;
   cooling the component from the predetermined temperature to a temperature below 50° C.; and
   removing the oxide-containing or oxynitride-containing product by an acid solution at the temperature below 50° C.

2. The method of claim 1, wherein the component includes aluminum; and wherein the predetermined temperature is between 100° C. and 400° C.

3. The method of claim 1, wherein the acid solution includes HF and HNO₃.

4. The method of claim 1, wherein the acid solution includes 0.1 to 20 wt % HF and 0.1 to 40 wt % HNO₃.

5. The method of claim 1, wherein the component includes stainless steel, nickel, ceramic, quartz, or combinations thereof.

6. The method of claim 1, wherein the heating includes oxidizing the nitride-containing by-product to form the oxide-containing or oxynitride- containing product, and the predetermined duration is between 2 and 36 hours.

7. The method of claim 1, further comprising:
   washing the component after the removal of the oxide-containing or oxynitride-containing product.

8. A method of removing a nitride-containing by-product from a component of a semiconductor apparatus, comprising:
   heating the component to a predetermined temperature for a predetermined duration between 2 and 36 hours, wherein the nitride-containing by-product is transformed into an oxide-containing or oxynitride-containing product by the heating;
   cooling the component from the predetermined temperature to a room temperature;
   rinsing the component with an acid solution including HF and HNO₃ at the room temperature after the cooling of the component; and
   washing the oxide-containing or oxynitride-containing product and the acid solution off the component.

9. The method of claim 8, wherein the component is heated in a chamber including air or nitrogen.

10. The method of claim 8, wherein the acid solution further includes a compound selected from a group consisting of H₂O₂, H₂SO₄, H₃PO₄, HCl, and combinations thereof.

11. The method of claim 8, wherein the oxide-containing or oxynitride-containing product and the acid solution are washed off by deionized water having a temperature between 35° C. and 60° C.

12. The method of claim 11, further comprising:
   applying an ultrasonic power to the deionized water.

13. The method of claim 8, wherein the component is a showerhead, an RF housing, or an electrode plate of an atomic layer deposition (ALD) tool.

14. The method of claim 8, wherein the predetermined temperature ranges between 100° C. and 1,000°° C.

15. The method of claim 8, wherein a heating rate of the heating of the component is between 0.5° C./min and 100° C./min.

16. The method of claim 8, wherein a cooling rate of the cooling of the component is between 0.5° C./min and 100° C./min.

17. A method of removing a nitride-containing by-product from a component of a semiconductor apparatus, comprising:
   providing the component in a chamber, wherein a surface of the component is at least partially covered by the nitride-containing by-product and at least one through hole of the component extends through the component and is at least partially contained with the nitride-containing by-product;
   injecting a gas into the chamber;
   heating the component to cause the nitride-containing by-product to react with the gas to form an oxide-containing or oxynitride-containing product on the component;
   cooling the component from the predetermined temperature to a temperature below 50° C.;
   rinsing the oxide-containing or oxynitride-containing product with an acid solution at the temperature below 50° C., wherein the acid solution includes HF and HNO₃; and removing the acid solution and the oxide-containing or oxynitride-containing product from the component to expose the surface and the through hole of the component.

18. The method of claim 17, wherein the oxide-containing or oxynitride-containing product is rinsed with the acid solution at the temperature below 50° C. for less than 3 minutes.

19. The method of claim 17, wherein the at least one through hole has a diameter less than 0.1 cm, and wherein the acid solution is injected into the at least one through hole to react with the oxide-containing or oxynitride-containing product disposed in the at least one through hole.

20. The method of claim 17, wherein the acid solution including the oxide-containing or oxynitride-containing product is removed out of the through hole by applying a positive pressure or a negative pressure.

* * * * *